INVENTOR
Eric Raymond Rout
BY
Kenyon, Palmer & Stewart
ATTORNEY

INVENTOR
Eric Raymond Rout
BY
Kemon, Palmer & Stewart
ATTORNEY

Jan. 15, 1963 E. R. ROUT 3,074,027

OSCILLATOR SYNCHRONISATION CIRCUITS UTILISING DIRECTLY APPLIED SYNC PULSES AND CONTROL VOLTAGE

Filed April 4, 1960 3 Sheets-Sheet 3

INVENTOR
Eric Raymond Rout
BY
Kemon, Palmer & Stewart
ATTORNEY

United States Patent Office 3,074,027
Patented Jan. 15, 1963

3,074,027

OSCILLATOR SYNCHRONISATION CIRCUITS UTILISING DIRECTLY APPLIED SYNC PULSES AND CONTROL VOLTAGE

Eric R. Rout, Lower Kingswood, England, assignor to Marconi's Wireless Telegraph Company Limited, London, England, a British company Filed Apr. 4, 1960, Ser. No. 19,801
Claims priority, application Great Britain Apr. 8, 1959
5 Claims. (Cl. 331—2)

Figure 1:
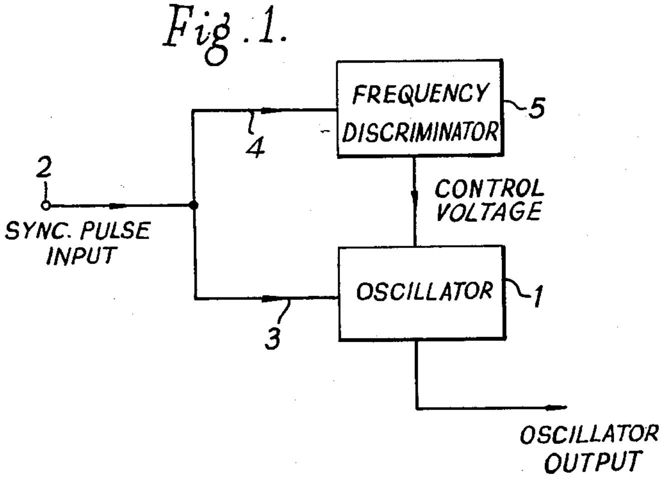

The present invention relates to circuits for the synchronisation of an oscillator with the frequency of an applied synchronising signal, capable of operating over a wide range of frequencies.

For example, in a television receiver it is sometimes desired to provide a line time base which can be synchronised by synchronising pulses of different frequencies corresponding to a number of different scanning standards. A blocking oscillator may be employed to provide the time base and if the synchronising pulses are of sufficient amplitude such a relaxation type of oscillator can be driven at a wide range of frequencies greater than its free running frequency. However, known synchronising circuits suffer from the disadvantage that the performance of the oscillator is liable to vary with the synchronising frequency, for example in regard to the time of firing relative to the epoch of the synchronising signal, sensitivity to spurious components of the synchronising signal, and constancy of output. An example of a spurious component that is required to be rejected so far as its influence on synchronisation is concerned is that of the twice-line-frequency pulses occuring during the field pulse periods of a television signal. In order to render such pulses ineffective it is necessary that the ratio of the free-running frequency to the synchronised frequency should not be too small. It is found that relaxation oscillators operate most satisfactorily when the ratio of the driven to the free-running frequency of the oscillator is about 1.3:1.

It is an object of the present invention to provide an improved circuit for the synchronisation of the operation of an oscillator with the frequency of an applied synchronising signal which will operate over a wide range of synchronising frequencies and in which the disadvantage referred to is overcome or at least substantially reduced.

According to the invention there is provided an oscillator synchronisation circuit including an oscillator, a frequency discriminator adapted to generate from an applied synchronising signal a control voltage dependent upon the frequency of the synchronising signal, means for applying the control voltage to the oscillator to vary the free-running frequency thereof in such a manner that the ratio between this free-running frequency and the synchronising signal frequency is maintained approximately constant, and means for applying the synchronising signal to the oscillator to effect synchronisation thereof.

The invention is applicable to oscillators of all kinds but at present appears to have most importance in relation to relaxation oscillators.

The free-running frequency of most relaxation oscillators, that is to say the frequency at which they operate by the relaxation mechanism alone, in the absence of a periodic driving or synchronising signal, can be varied by altering the values of the resistive or reactive circuit elements determining the time constant of the oscillator or by altering the "aiming" voltage so as to change the rate of recovery of the oscillator after discharge.

The "aiming" voltage is the value towards which a voltage at some point in the oscillator tends during the relatively slowly changing part of the wave form, the return stroke being initiated before this voltage is reached.

The frequencies of oscillators other than relaxation oscillators can similarly be varied by altering the values of certain circuit elements and this alteration can be arranged to take place under the control of an applied control voltage.

Figure 2:
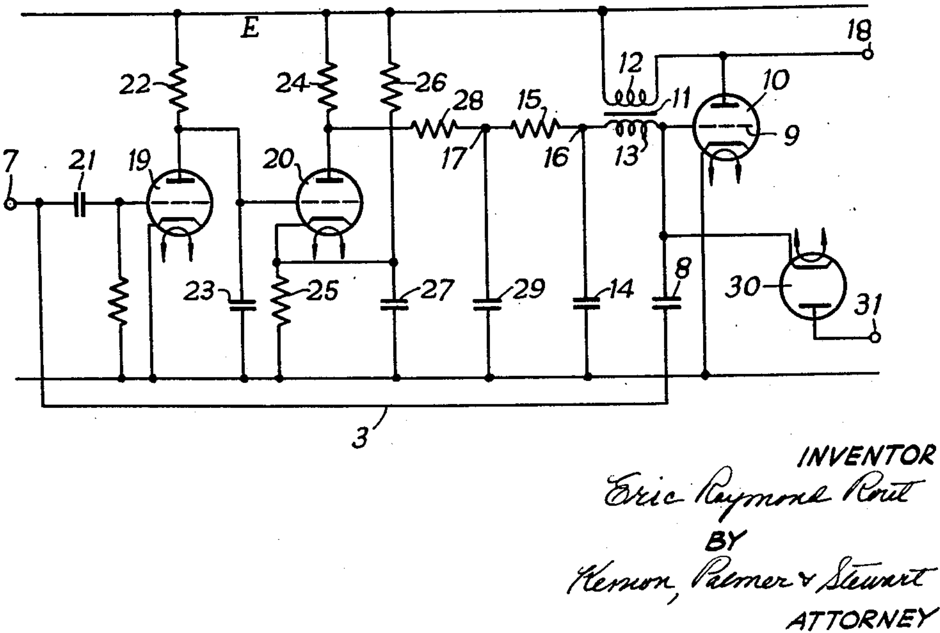
Figure 3:
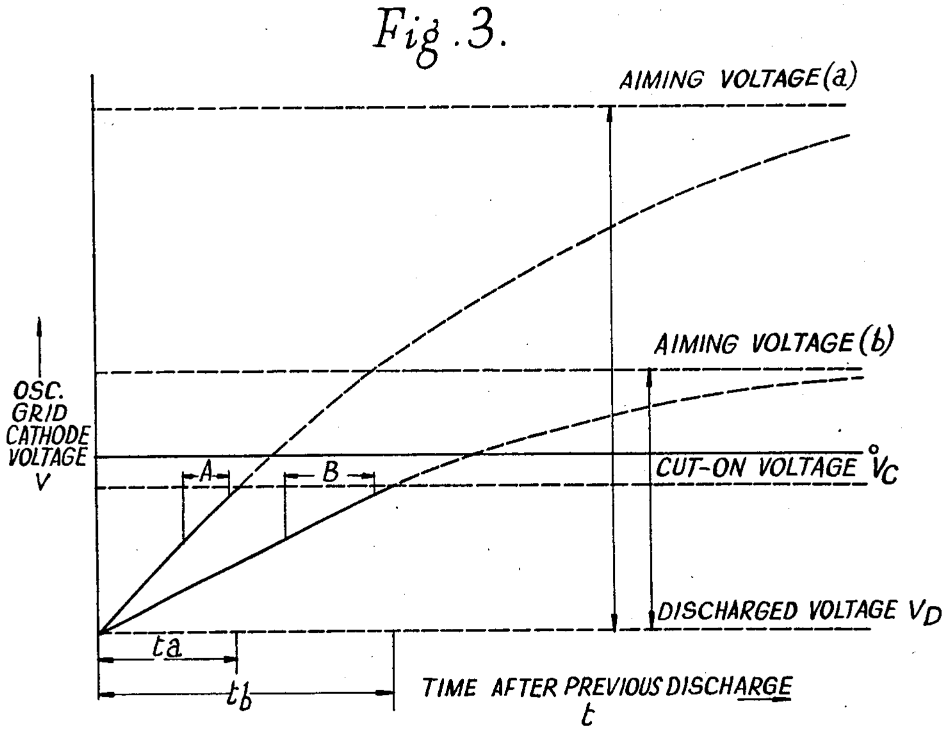
Figure 4:
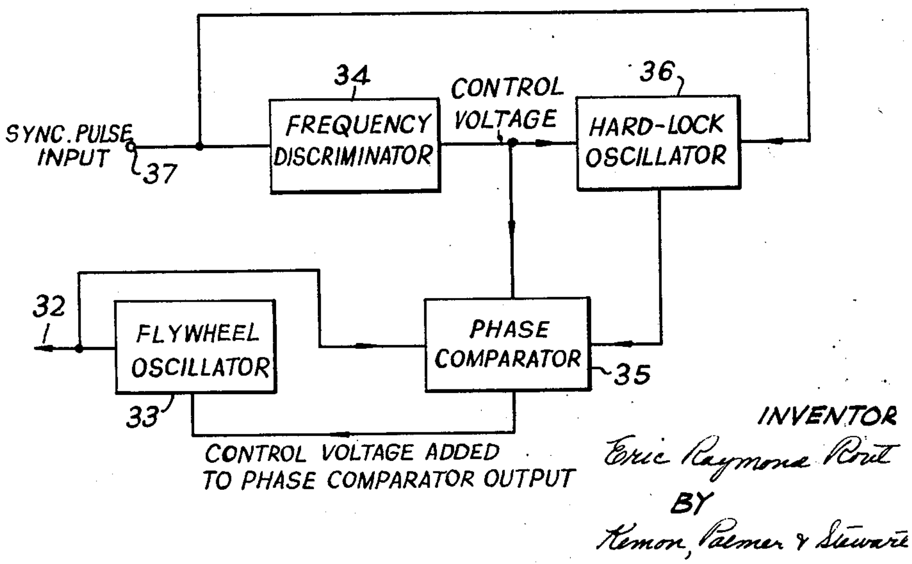
Figure 5:
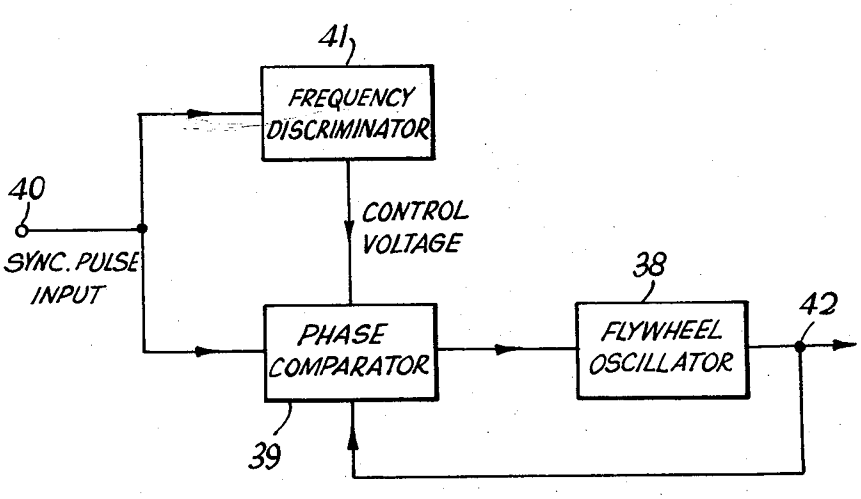

By way of example, specific embodiments of the invention will now be described with reference to the accompanying drawings, in which FIG. 1 is a block diagram of one embodiment of the invention, FIG. 2 is a circuit diagram of the embodiment of FIG. 1, FIG. 3 is a graph illustrating certain characteristics of the relaxation oscillation employed in the embodiment of FIGS. 1 and 2, FIG. 4 is a block diagram of a second embodiment, and FIG. 5 is a block diagram of a third embodiment.

In FIG. 1 an oscillator 1 is driven by synchronising pulses applied at a terminal 2. The applied synchronising pulses are fed directly to the oscillator 1 along a path 3 and are also fed along a parallel path 4 to a frequency discriminator 5. The output voltage from the frequency discriminator 5, proportional to the frequency of the synchronising pulses, is applied to the oscillator 1, as a control voltage controlling the free-running frequency. As will be explained later the control voltage increases linearly with the synchronising frequency and the free-running frequency can be made approximately linearly dependent on the control voltage with the result that the free-running frequency is always nearly directly proportional to the synchronising frequency.

As shown in the circuit diagram of FIG. 2 the synchronising signal, in the form of periodic pulses, applied to the input terminal 7, is fed by the path 3 through a coupling capacitor 8 direct to the grid 9 of a triode 10 arranged as a blocking oscillator. The anode circuit of the triode 10 is coupled to its grid circuit by a transformer 11, with windings 12 and 13 in the anode and grid circuits respectively, in such a manner that when a discharge commences in the triode 10 the grid is driven more positive by the anode current and the discharge is eventually cut off when a large grid current drives the grid 9 negative by charging a capacitor 14, of value $C_0$, in the grid-cathode circuit of the triode 10.

The discharge is limited by a discharge-limiting diode 30 connected to a negative reference potential at 31.

A resistor 15, of value $R_0$, connects the junction 16 of the capacitor 14 and the winding 13 to a point 17, which as will be described is maintained at a constant potential as long as the frequency of the synchronising signal does not change. Thus the rate of recovery of the grid potential is determined by the time constant $R_0C_0$ and the voltage (hereinbefore referred to as the control voltage) at which the point 17 is maintained, and the free-running frequency of the blocking oscillator, in the absence of synchronising pulses, will be determined by these factors. The output from the oscillator is taken from the anode at a terminal 18.

FIG. 3 illustrates the behaviour of the blocking oscillator for two different aiming voltages, the grid-cathode voltage V being plotted against the time $t$ from the termination of the previous discharge. The aiming voltage is the voltage to which the recovery curve of the grid-cathode voltage is asymptotic and is measured from the value $V_D$ of that voltage in the discharged condition of the capacitor 14. It is determined by the voltage at which the point 17 is maintained, changes in this voltage producing equal changes in the aiming voltage.

It will be seen that for aiming voltages ($a$) and ($b$) the time intervals $t_a$ and $t_b$ between successive discharges are substantially inversely proportional to the aiming voltage. This is true providing that the time constant $R_0C_0$ is large compared with the period of the synchronising pulses and that the timing voltage is always high relative to the grid-cathode voltage $V_c$ at which the triode cuts on and the discharge commences. Assuming the aiming voltage to have been adjusted to the value (*a*), a synchronising pulse may be applied to drive the oscillator at any time within the interval A to achieve synchronisation, but is preferably arranged to occur at about $\frac{3}{4}t_a$ after the termination of the previous discharge. Similarly for aiming voltage (*b*) the synchronising pulse may be applied at any time within the interval B.

In order to ensure that the period of the synchronising pulses is always the desired fraction of the free-running period the latter is adjusted, within the range $t_a$ to $t_b$, by changing the aiming voltage in linear dependence upon the synchronising frequency. This is achieved by the use of the frequency discriminator including triodes 19 and 20 (FIG. 2). The synchronising signal from the input terminal 7 is applied along the path 4 through a coupling capacitor 21 to the grid of the triode 19. A resistor 22, of value $R_D$, is connected in the anode circuit of the triode 19 and the anode of the triode 19 is connected directly to the grid of the triode 20, and through a capacitor 23, of value $C_D$, to earth. The anode circuit of the triode 20 contains a resistor 24 of value $R_A$, while the cathode is connected to the junction of two resistors 25 and 26 connected between earth and the H.T. line, the junction being connected to earth through a capacitor 27.

The positive synchronising pulses applied to the grid of the triode 19 allow the capacitor 23 to be discharged through the triode 19 and thus cause the triode 20 to cut off. After an interval T from the termination of the synchronising pulses, this interval being determined by the time constant $R_DC_D$, the supply voltage E to which the resistor 24 is connected, and the cathode bias of the triode 20, anode current through the resistor 24 is restored and continues until the arrival of the next synchronising pulse. The anode current of the valve 20 is limited by grid current through the resistor 22. The mean value $I_{mean}$ of the anode current is a linear function of the frequency $f_s$ of the mean synchronising pulses, the relation being of the form $$I_{mean}=I_{peak}(1-Tf_s)$$

Thus the mean anode voltage $E_A$ is given by $$E_A=E+R_AI_{peak}(Tf_s-1)$$

$E_A$ is the control voltage which is maintained at the point 17, this point being connected to the anode of the triode 20 through a resistor 28 and to earth through a capacitor 29. Thus the aiming voltage of the blocking oscillator is made linearly dependent on the synchronising frequency and the desired proportionality of the synchronising and free-running frequencies is achieved.

In the modified form of embodiment shown in FIG. 4 the ultimate output is taken at 32 from a flywheel oscillator 33. This oscillator is arranged to run at the frequency of the synchronising pulses applied at 37 when supplied with the control voltage from the discriminator 34. The control voltage is applied to the oscillator 33 through a phase comparator 35 which adds thereto an error signal dependent upon the phase difference between the output of a "hard-lock" oscillator 36 and the output of the flywheel oscillator 33.

A "hard-lock" oscillator is one that locks strongly to a predetermined free-running frequency. It may be a relaxation or an LC type oscillator. A flywheel oscillator, on the other hand, is one whose frequency can be locked to that of an applied synchronising signal and which has sufficient inertia to maintain this frequency despite random variation in the synchronising frequency, but which can change its frequency slowly to lock to a new synchronising frequency.

The oscillator 36 takes the place of the oscillator 1 in FIG. 1 and its main function in FIG. 4 is to remove from the synchronising signals unwanted frequency components such as twice-line-frequency pulses occurring in a television waveform. The "hard-lock" oscillator 36 may have a free-running frequency which is approximately 0.7 of the synchronising pulse frequency.

Thus the synchronising pulses applied at 37 are fed to the "hard-lock" oscillator 36 and to the frequency discriminator and the output from the frequency discriminator forms a control voltage governing the free-running frequency of the oscillator 36. The control voltage also controls the oscillations of the flywheel oscillator which are also automatically maintained substantially in phase with the output from the "hard-lock" oscillator.

In the embodiment of FIG. 5 the oscillator 1 of FIG. 1 is replaced by a flywheel oscillator 38 and a phase comparator 39. The synchronising pulses applied to an input terminal 40 are fed to a frequency discriminator 41 and to the phase comparator 39. The output from the flywheel oscillator 38 is taken at 42 and a part of this output is fed back to the phase comparator 39 for comparison with the synchronising pulses. The control voltage from the frequency discriminator 41 is applied through the phase comparator 39 to control the frequency of the flywheel oscillator 38 in accordance with the synchronising frequency and is adjusted as a result of the phase comparison to effect precise synchronism.

It will be apparent that the circuit of FIG. 5 is equivalent to that of FIG. 4 with the hard-lock oscillator 36 omitted and the input terminal 37 connected directly to the phase comparator 35.

I claim:

1. An oscillator synchronisation circuit including an oscillator, a frequency discriminator adapted to generate from an applied synchronising signal a control voltage dependent upon the frequency of the synchronising signal, means for applying the control voltage to the oscillator to vary the free-running frequency thereof in such a manner that the ratio between this free-running frequency and the synchronising signal frequency is maintained approximately constant, and means for applying the synchronising signal to the oscillator to effect synchronisation thereof.

2. A circuit as claimed in claim 1 in which the oscillator is a relaxation oscillator.

3. A circuit as claimed in claim 2 in which the oscillator is a blocking oscillator, the said means for varying the free-running frequency of the oscillator include a resistance-capacitance network coupled between the output of the frequency discriminator and the control grid of the valve of the blocking oscillator, the control voltage at the output of the frequency discriminator and the time constant of the resistance-capacitance network determining the recovery time of the oscillator in the free-running state, and the means for applying the synchronising signal to the oscillator include a capacitor coupling the input terminal of the circuit to the said grid.

4. A circuit as claimed in claim 2 and in which the oscillator is a hard-lock oscillator, the circuit including a flywheel oscillator and a phase comparator connected to compare the outputs of the hard-lock and flywheel oscillator and apply a signal representative of the phase difference between them, in combination with the control voltage, to adjust the frequency of the flywheel oscillator.

5. A circuit as claimed in claim 1 in which the frequency discriminator includes a triode with an anode load and a capacitor in its grid-cathode circuit, and a second valve arranged to effect discharge of the capacitor to cut off the current through the triode when triggered by each pulse of the synchronising signal, whereby the mean anode voltage of the triode is linearly dependent on the frequency of the synchronising signal and can serve as the control voltage.

References Cited in the file of this patent

UNITED STATES PATENTS

| | | |
|---|---|---|
| 2,654,033 | Dome | Sept. 29, 1953 |
| 2,743,362 | Leed | Apr. 24, 1956 |

UNITED STATES PATENT OFFICE

CERTIFICATE OF CORRECTION

Patent No. 3,074,027 January 15, 1963

Eric R. Rout

It is hereby certified that error appears in the above numbered patent requiring correction and that the said Letters Patent should read as corrected below.

In the grant, lines 2 and 3, for "assignor to Marconi's Wireless Telegraph Company Limited, of London, England, a British company," read -- assignor to Marconi's Wireless Telegraph Company Limited, of London, England, a British company, and Standard Telephones & Cables Limited, of London, England, a British company, --; line 12, for "Marconi's Wireless Telegraph Company Limited, its successors" read -- Marconi's Wireless Telegraph Company Limited and Standard Telephones & Cables Limited, their successors --; in the heading to the printed specification, lines 5 to 7, for "assignor to Marconi's Wireless Telegraph Company Limited, London, England, a British company" read -- assignor to Marconi's Wireless Telegraph Company Limited, London, England, a British company, and Standard Telephones & Cables Limited, London, England, a British company --.

Signed and sealed this 1st day of October 1963.

(SEAL)
Attest:

ERNEST W. SWIDER
Attesting Officer

DAVID L. LADD
Commissioner of Patents